(12) United States Patent
Mukai

(10) Patent No.: US 7,142,241 B1
(45) Date of Patent: Nov. 28, 2006

(54) IMAGE PICKUP DEVICE

(75) Inventor: Hiromu Mukai, Kawachinagano (JP)

(73) Assignee: Minolta Co., Ltd., Osaka (JP)

( * ) Notice: Subject to any disclaimer, the term of this patent is extended or adjusted under 35 U.S.C. 154(b) by 0 days.

(21) Appl. No.: 09/377,667

(22) Filed: Aug. 19, 1999

(30) Foreign Application Priority Data

Aug. 28, 1998 (JP) ................. 10-243869

(51) Int. Cl.
*H04N 5/335* (2006.01)
*H01L 27/14* (2006.01)

(52) U.S. Cl. .................... 348/335; 348/340

(58) Field of Classification Search ........... 348/340, 348/335; 396/194, 257, 170, 220, 222, 258, 396/259, 260, 261, 262, 435, 449, 450, 451, 396/458, 485, 505, 507, 510
See application file for complete search history.

(56) References Cited

U.S. PATENT DOCUMENTS

| | | | | |
|---|---|---|---|---|
| 4,230,942 A | * | 10/1980 | Stauffer | 250/204 |
| 4,743,932 A | * | 5/1988 | Matsui | 396/92 |
| 4,746,948 A | * | 5/1988 | Matsui | 396/129 |
| 4,908,504 A | * | 3/1990 | Karasaki et al. | 250/201.2 |
| 5,121,213 A | * | 6/1992 | Nishioka | 348/335 |
| 5,260,826 A | * | 11/1993 | Wu | 359/368 |
| 5,365,307 A | * | 11/1994 | Sugiyama | 355/45 |
| 5,465,131 A | * | 11/1995 | Haraguchi et al. | 396/61 |
| 5,510,826 A | * | 4/1996 | Koide | 347/256 |
| 5,654,565 A | * | 8/1997 | Hokari | 257/222 |
| 5,673,246 A | * | 9/1997 | Ootaki et al. | 369/112.23 |
| 5,732,298 A | * | 3/1998 | Nishizawa et al. | 396/380 |
| 5,790,906 A | * | 8/1998 | Chan | 396/322 |
| 5,945,670 A | * | 8/1999 | Rudeen | 250/235 |

FOREIGN PATENT DOCUMENTS

| | | | | |
|---|---|---|---|---|
| GB | 2164470 A | * | 3/1986 | |
| JP | 2-148011 A | | 6/1990 | |
| JP | 4-217235 A | | 8/1992 | |
| JP | 04348331 A | * | 12/1992 | |
| JP | 05-100179 | * | 4/1993 | |
| JP | 06186622 A | * | 7/1994 | |
| JP | 6-64218 U | | 9/1994 | |
| JP | 6-331891 | | 12/1994 | |
| JP | 7-50401 A | | 2/1995 | |
| JP | 8-220584 | | 8/1996 | |
| JP | 8-234267 A | | 9/1996 | |
| JP | 08330557 A | * | 12/1996 | |
| JP | 10-107975 | | 4/1998 | |
| JP | 11052451 A | * | 2/1999 | |

OTHER PUBLICATIONS

Machine translation of JP 08-330557 to Uchiya.*
Machine translation of JP 07-050401, Sony Corp., Feb. 1995.*
Notification of Reason(s) for Refusal, dated Apr. 6, 2004, for counterpart Japanese Patent Application No. 10-243869; along with an English-language translation thereof.

(Continued)

*Primary Examiner*—David Ometz
(74) *Attorney, Agent, or Firm*—Sidley Austin LLP

(57) ABSTRACT

An image pickup device has an image sensor having rectangular light receiving portions arranged in a matrix, and microlenses disposed in correspondence with said light receiving portions, said light receiving portions and said microlenses being formed integrally with each other, an image input optical system for forming an image on said image sensor, said image input optical system including a diaphragm whose shape in a horizontal direction coincides with a shape of said light receiving portions of said image sensor.

15 Claims, 6 Drawing Sheets

OTHER PUBLICATIONS

Notification of Reason(s) for Refusal, dated Apr. 12, 2005, for counterpart Japanese Patent Application No. 10-243869; along with an English-language translation thereof.

Notification of Reason(s) for Refusal, dated Aug. 9, 2005, for counterpart Japanese Patent Application No. 10-243869; along with an English-language translation thereof.

* cited by examiner

IMAGE PICKUP DEVICE

RELATED APPLICATION

This application is based on application No. 10-243869 filed in Japan, the content of which is hereby incorporated by reference.

BACKGROUND OF THE INVENTION

1. Field of the Invention

The present invention relates to an image pickup device having an image input optical system for forming an image on light receiving portions of an image sensor such as a CCD sensor or a CMOS sensor.

2. Description of the Prior Art

An image sensor has light receiving portions arranged in a matrix, and vertically transferring portions for transferring charges generated by the light receiving portions in a vertical direction. FIG. 11 is a cross-sectional view showing one pixel of the image sensor. A photodiode (light receiving) portion 5' constituting the light receiving portion and a vertical register portion 6' constituting the vertically transferring portion are disposed on a silicon layer 10 serving as a substrate. An insulative film 11 such as $SiO_2$ is formed on the silicon layer 10. An electrode 8 for charge transfer is disposed on the register portion 6'. An aluminum light intercepting film 7 is disposed over the register portion 6' and over a part of the photodiode portion 5'. Because of the presence of the light intercepting film 7, no light is directly incident on the top of the register portion 6'. In order that no light is incident on the register portion 6' from a slanting direction, a predetermined distance d is set between the register portion 6' and the light receivable part of the photodiode portion 5'.

However, the light receiving portions of the image sensor are longitudinally elongated in one column, whereas the luminous flux from an image input optical system for inputting light to the image sensor is circular in cross section. For this reason, part of the input luminous flux is incident on areas outside the light receiving portions, and further, in the part of the luminous flux that is obliquely incident on the light receiving portions, the part incident on areas outside the light receiving portions corresponds to the light A in FIG. 11 being obliquely incident to reach the adjacent register portion 6', so that smears are generated. As a result, an output of high image quality cannot be obtained. Some of the luminous flux turns to reach the side of the register portion 6' to affect the register portion 6' after reflected at the light intercepting film like the light B.

SUMMARY OF THE INVENTION

An object of the present invention is to provide an improved image pickup device.

Another object of the present invention is to provide an image pickup device capable of reducing the generation of smears in the image sensor.

In order to attain the object, an image pickup device according to one aspect of the present invention has an image sensor having rectangular light receiving portions arranged in a matrix, and microlenses disposed in correspondence with said light receiving portions, said light receiving portions and said microlenses being formed integrally with each other, an image input optical system for forming an image on said image sensor, said image input optical system including a diaphragm whose shape in a horizontal direction coincides with a shape of said light receiving portions of said image sensor.

Further, in order to attain the object, an image pickup device according to another aspect of the present invention has an image sensor having rectangular light receiving portions arranged in a matrix, and microlenses disposed in correspondence with said light receiving portions, said light receiving portions and said microlenses being formed integrally with each other, an image input optical system for forming an image on said image sensor, said image input optical system including a diaphragm and a light restricting plate whose shape in a horizontal direction coincides with a shape of said light receiving portions of said image sensor, said light restricting plate being provided separately from said diaphragm.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENT

First Embodiment

Figure 1:
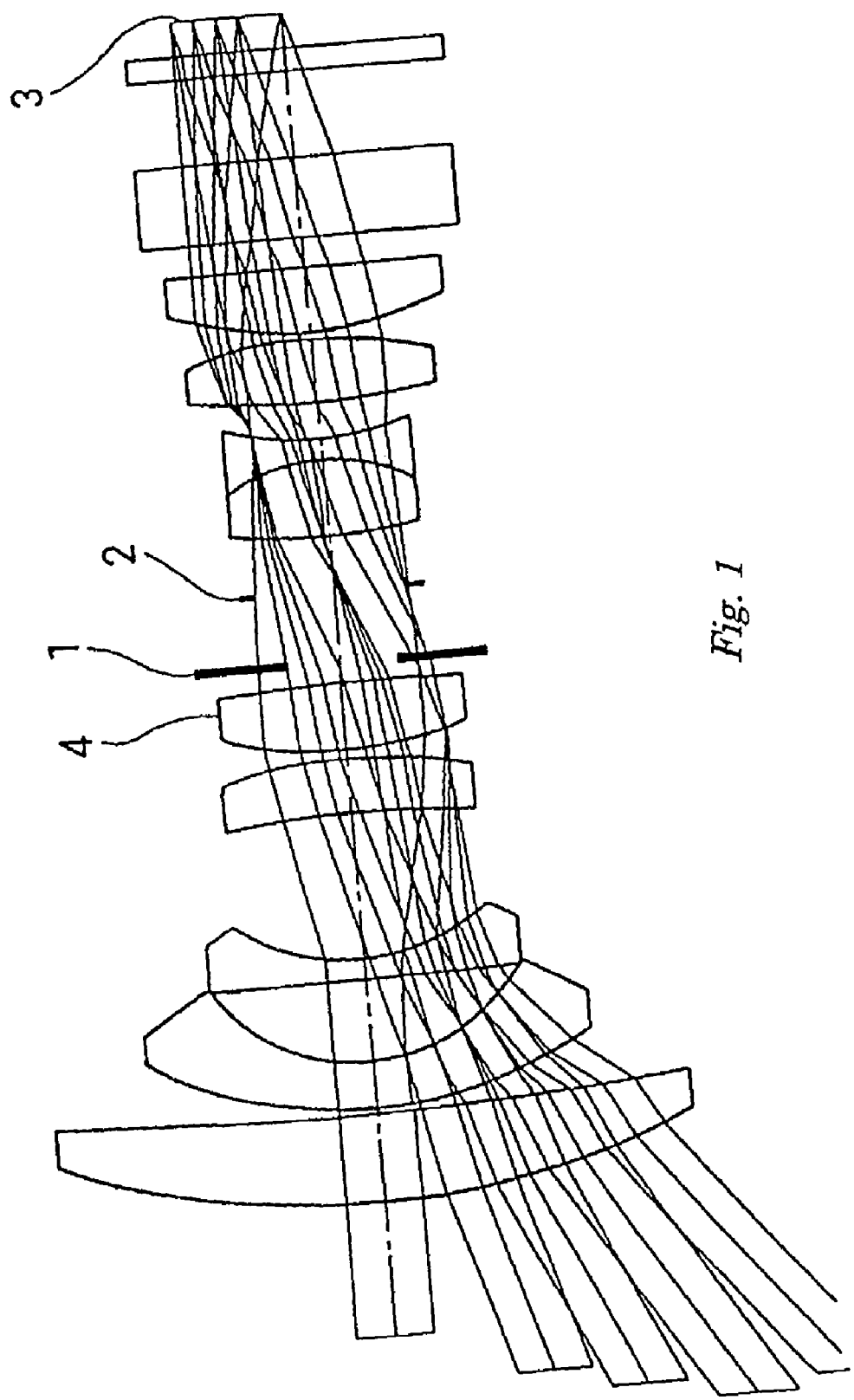
FIG. 1 shows the structure of an image pickup device according to a first embodiment of the present invention.

Hereinafter, preferred embodiments of the present invention will be described. FIG. 1 shows the structure of an image pickup device according to a first embodiment of the present invention. A light restricting plate 1 and a diaphragm 2 are inserted in an image input optical system comprising a plurality of lens elements. An image sensor 3 comprising a CCD is disposed at the image plane of the image input optical system.

Figure 2:
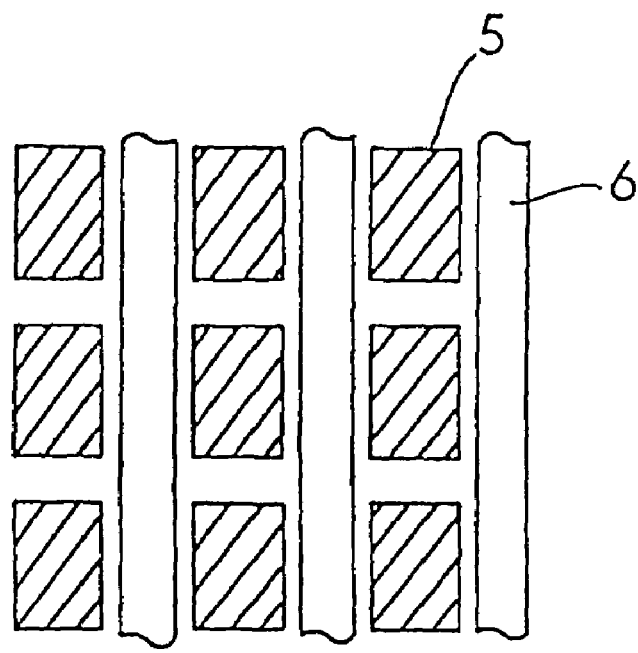
FIG. 2 shows a part of a CCD sensor of the image pickup device.

FIG. 2 shows the pixel structure of the image sensor 3. The image sensor 3 comprises light receiving portions 5 arranged in a matrix, and vertically transferring portions 6. The light receiving portions 5 each comprise, for example, a photodiode, and generate charges that are proportional to the intensity of the received light. The vertically transferring portions 6 are formed so as to adjoin the light receiving portion columns. The structure of the image sensor 3 is detailed in FIG. 11.

Figure 3:
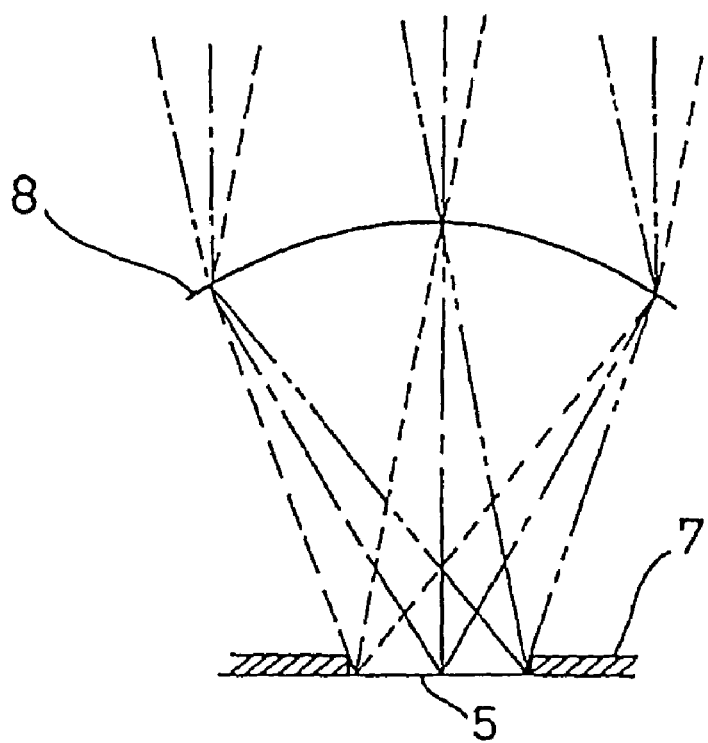
FIG. 3 shows the structure of one light receiving portion of the CCD sensor.

When the pixel density of the image sensor 3 is increased, the size of the light receiving portions 5 is decreased, so that a great output cannot be obtained. For this reason, in recent image sensors 3, a microlens 8 is disposed in correspondence with each light receiving portion as shown in FIG. 3 in order to obtain a high vignetting factor. Reference number 7 represents a light intercepting aluminum film formed over the area other than the light receiving portions 5. Since light can be condensed in an area larger than the light receiving portion 5 by the microlens 8 as shown in the figure, the signal charge amount at the light receiving portion 5 increases. In the image sensor having the microlenses, strictly, an image is formed at the vertices of the microlenses. At this time, in the image, the diaphragm of the input optical system and the light receiving portions of the image sensor are in a conjugate relationship because of a working of the microlenses. When such a relationship is satisfied, the shape of the diaphragm (or the shape of the restricting plate) is very important as described later.

Figure 4:
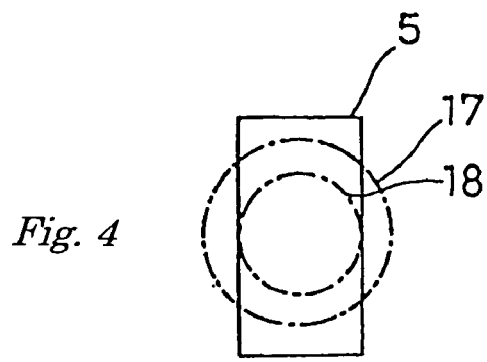
FIG. 4 is a cross-sectional view of a part of the CCD sensor.

FIG. 4 shows, with respect to the light receiving portion 5, the difference in width of the incident luminous flux due to the difference in lens aperture, that is, in F number. Here, the smaller circle 18 represents the luminous flux in the case where the image input optical system has a small aperture, and the larger circle 17 represents the luminous flux in the case where the optical system has a large aperture. Since the light receiving portion 5 is elongated not in the horizontal direction but in the vertical direction, part of the luminous flux is incident on the areas horizontally adjoining the light receiving portion 5 as shown by the circle 17 in the case of the large-aperture optical system, so that only a luminous flux of f/3.0 to f/4.0 is incident on the light receiving portion 5. When part of the luminous flux is incident on areas outside the light receiving portion 5 as shown by the circle 18, the part affects the vertically transferring portions (registers) 6, so that smears are generated.

Figure 5:
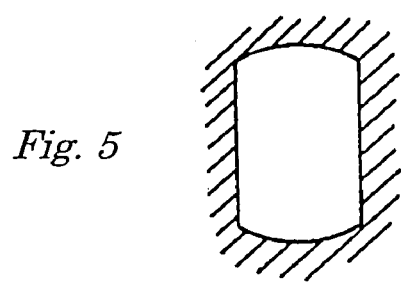
FIG. 5 shows the shape of a diaphragm provided in an image input optical system.

Therefore, the luminous flux can appropriately be restricted with respect to the light receiving portion 5 when the diaphragm has, for example, a small oval shape as shown in FIG. 5. That is, as long as having this shape, the diaphragm can appropriately restrict light in the horizontal direction at the left and the right ends of the light receiving portion 5. Consequently, no light is incident on the vertical register portion 6 (see FIG. 11), so that the generation of smears is reduced. Further, with respect to the vertical direction, since light is incident on a large area of the light receiving portion 5, light is efficiently received. While the edges of the oval shape of FIG. 5 are linear along the vertical direction in correspondence with the shape of the light receiving portion, the edges are circular along the horizontal direction. The circular shape along the horizontal direction is decided in accordance with the effective aperture of the image input optical system. The shape along the vertical direction is decided based on the angle of view of the image sensor.

Since the diaphragm 2 has an oval shape, the luminous flux in the horizontal direction is cut with respect to the image sensor 3 to thereby restrain the generation of smears, and the quantity of light incident in the vertical direction is increased so that signal charges are generated with efficiency.

Figure 9:
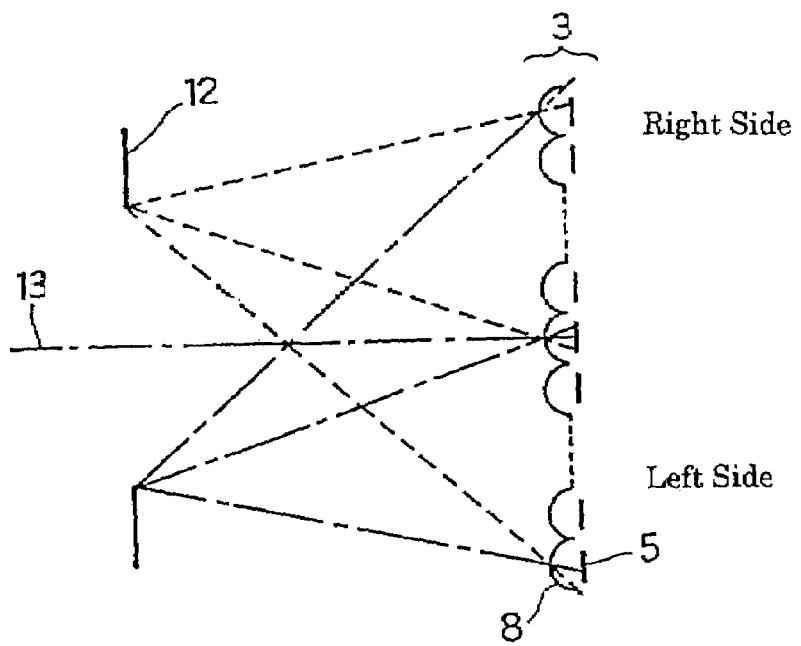
FIG. 9 shows a relationship between the pupil of the image input optical system and an image sensor.
Figure 10:
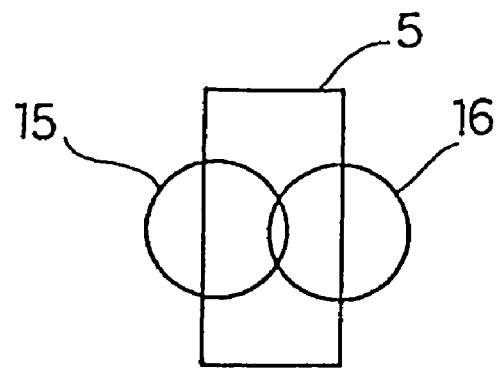
FIG. 10 shows positions of the luminous flux being incident on the light receiving portions of the image sensor.
Figure 11:
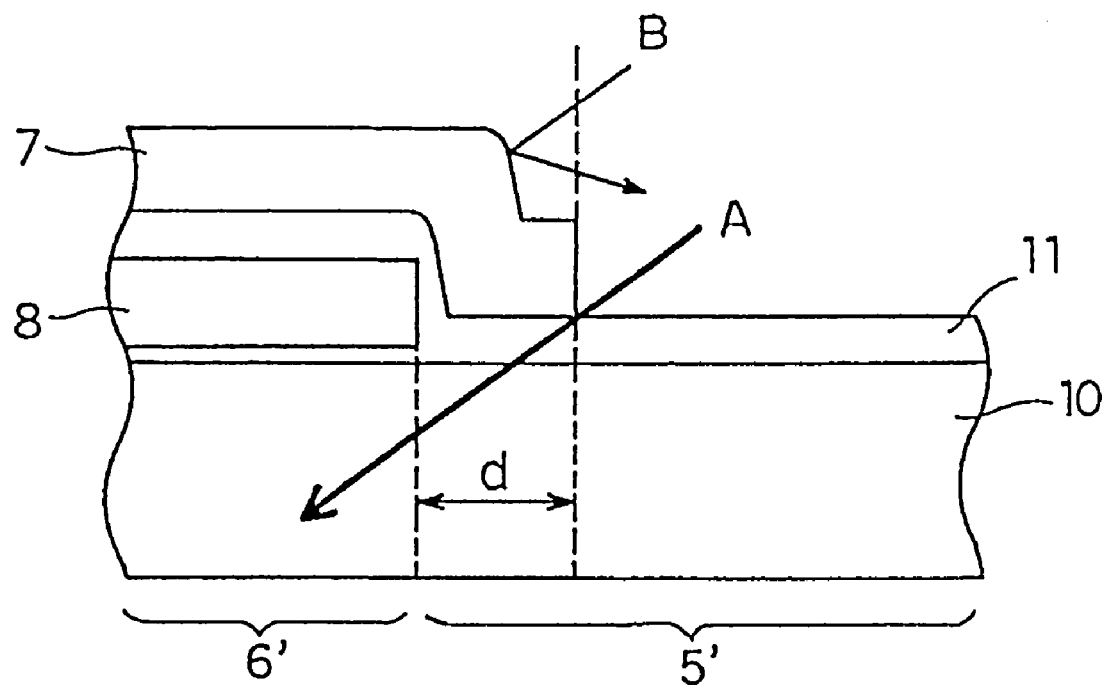
FIG. 11 is a cross-sectional view of a part of a light receiving portion of an image sensor, for explaining a cause of smears generated in an image pickup device.

Consequently, a high-quality image with few smears is obtained without the output of the image sensor 3 being largely reduced. The diaphragm 2 does not necessarily have the oval shape but may have a shape, for example, where the edges are linear along the vertical direction and are also linear along the horizontal direction. Moreover, the linear shape of the edges along the vertical direction may be provided only on one side. FIG. 9 shows a phenomenon in which smears are generated due to a displacement between the entrance pupil and the exit pupil of the input optical system, Normally, the entrance pupil of the input optical system is set at infinity. That is, the image sensor 3 is set on the assumption that a parallel light ray is incident thereon through the image input optical system. The exit pupil of the image input optical system is frequently situated at a finite distance with respect to the image sensor 3. For this reason, there is a displacement between the entrance pupil and the exit pupil, so that the luminous flux is obliquely incident on the light receiving portions 5 of the image sensor 3 as shown in FIG. 9. Consequently, the relative position relationship of the luminous flux with respect to the light receiving surface is different between on the right and the left sides of the image sensor. For this reason, light enters the vertical transferring portion 6 as shown in FIG. 11, so that smears are largely generated. A light restricting plate 4 may be used for restricting the generation of the smears.

Figure 6:
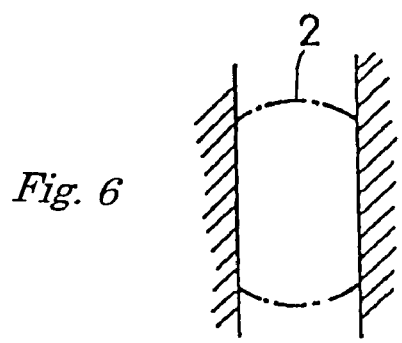
FIG. 6 shows another shape of the diaphragm.

For example, in FIG. 1, the light restricting plate 1 for restricting the luminous flux in the horizontal direction is inserted separately from the diaphragm 2. In this embodiment, the light restricting plate 1 is inserted directly behind a lens 4 disposed ahead of the diaphragm 2. The light restricting plate 1 has a shape being cut along two parallel straight lines in the vertical direction as shown in FIG. 6. Consequently, the luminous flux incident on the light receiving portion 5 which luminous flux has been restricted by the diaphragm 2 into a circular shape is further restricted by the light restricting plate 1 as shown in FIG. 12, so that the luminous flux has a shape being cut along two parallel straight lines in the vertical direction so as to coincide with the vertical direction shape of the light receiving portion 5.

Figure 12:
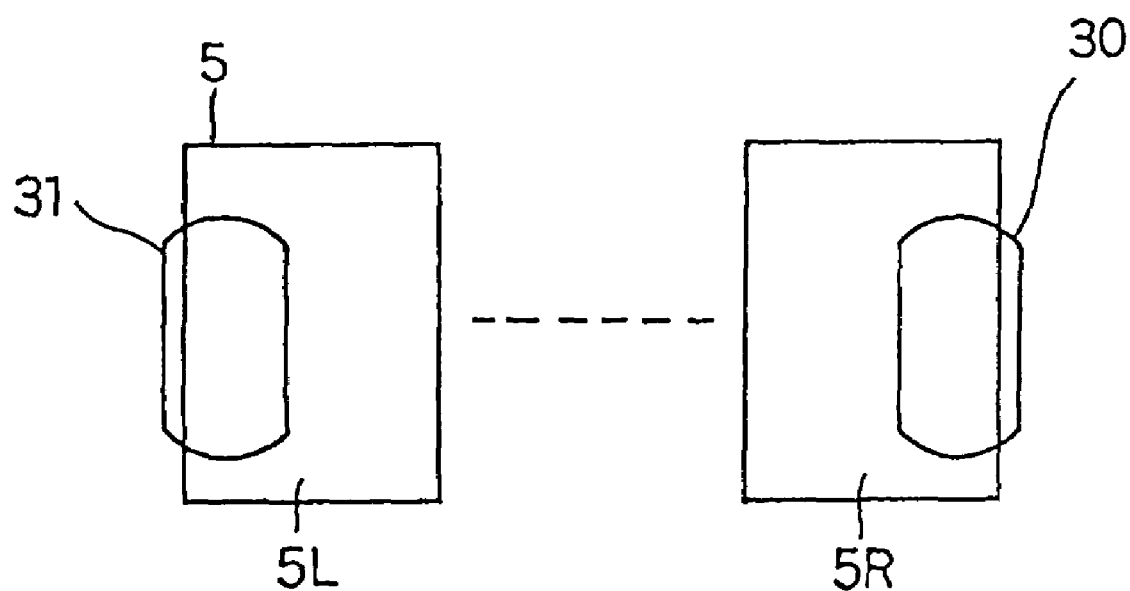
FIG. 12 shows the luminous fluxes incident on both sides of the image sensor of the image pickup device according to the embodiment of the present invention.

In FIG. 12, reference number 30 represents the luminous flux incident on a light receiving portion 5R on the right side of the image sensor 3, whereas reference numeral 31 represents the luminous flux incident on a light receiving portion 5L on the left side of the image sensor 3. With this arrangement, the quantity of the light directly incident on the vertical register portion 6 from a slanting direction or of the light incident on the portion 6 by being reflected at the light intercepting film 7 is reduced on the right and the left sides of the image sensor 3, so that the generation of smears in the image sensor 3 is reduced.

Figure 7:
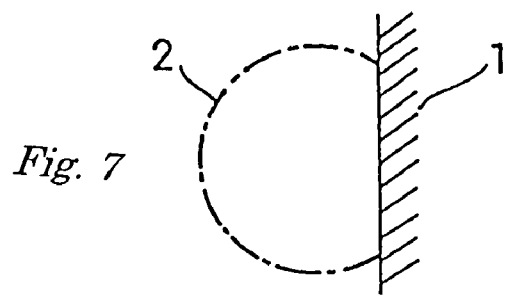
FIG. 7 shows still another shape of the diaphragm.

The level of the smears generated in the image sensor 3 sometimes differs between on the right and the left sides. For this reason, the smear level is also reduced by inserting the light restricting plate for intercepting light on the side where the smear level is higher as shown in FIG. 7. In this case, since the fabrication is easier than in the case where the light restricting plate shown in FIG. 6 is inserted, the manufacturing cost is reduced.

Second Embodiment

Figure 8:
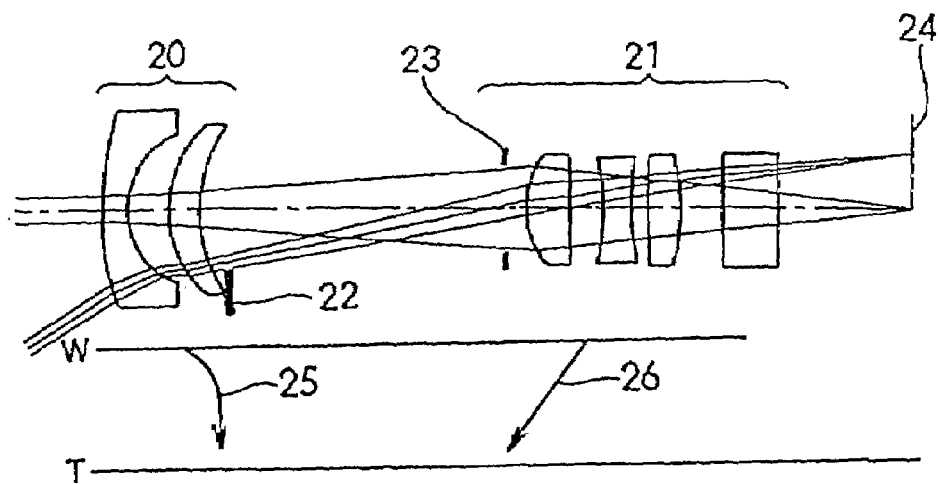
FIG. 8 shows the structure of an image pickup device according to a second embodiment of the present invention.

Subsequently, a second embodiment of the present invention will be described. FIG. 8 shows the structure of an image pickup device according to the second embodiment. The optical system of this embodiment is a two-component zoom lens optical system of a negative and a positive lens element configuration. A restricting plate 22 is disposed in a first lens unit 20, and a diaphragm 23 is disposed in a second lens unit 21. The restricting plate 22, which is not limited thereto, is disposed only on one side as shown in FIG. 7. First, light having passed through the first lens unit 20 has its luminous flux restricted by the light restricting plate (restricting plate) 22 and has its quantity adjusted by the diaphragm 23. Then, the light passes through the second lens unit 21 to reach the image sensor 24. The image sensor 24 has a structure as shown in FIGS. 2 and 3. FIG. 8 shows the wide-angle condition (W). The first lens unit 20 first approaches the second lens unit 21 and then, moves away therefrom to make a U-turn as shown by the arrow 25 and the second lens unit 21 approaches the first lens unit 20 as shown by the arrow 26, whereby the optical system is brought to the telephoto condition (T).

Here, when the aperture of the diaphragm 23 is invariable, the aperture of the image input optical system is larger in the wide-angle condition than in the telephoto condition, and the generation of smears is greater in the wide-angle condition. It is most effective in preventing the generation of smears that the F number in the horizontal direction is invariable during zooming. This can be achieved by increasing the aperture of the diaphragm 23 in the horizontal direction in accordance with the driving of the second lens unit 21 to the telephoto condition.

In this case, however, a driving mechanism for varying the aperture of the diaphragm 23 is required, so that the structure is complicated. Therefore, in this embodiment, in the wide-angle condition, the light restricting plate 22 is used to reduce the generation of smears. In the telephoto condition, the luminous flux adjustment is made by the diaphragm 23. Consequently, the generation of smears in the wide-angle condition is reduced with a simple structure. As a result, smears in the wide-angle condition are improved with a simple structure.

According to the zooming image pickup device of this embodiment, the luminous flux in the horizontal direction can be restricted by the restricting plate 22 provided separately from the diaphragm 23, so that the generation of smears can be reduced with a simple structure. Moreover, in this embodiment, the restricting plate 22, which restricts light only in one direction of the image sensor 24, can easily be fabricated.

As described above, according to the present invention, in the image input optical system, the luminous flux is restricted by the diaphragm or the restricting plate formed based on the shape of the image sensor, so that smears are significantly improved without the output level at the image sensor being largely reduced.

Moreover, since the diaphragm 23 has an oval shape with edges that are linear along the vertical direction and are circular along the horizontal direction, the luminous flux is linearly restricted to reduce the generation of smears in the horizontal direction, the large reduction in light quantity is prevented in accordance with the effective aperture.

Although the present invention has been fully described by way of example with reference to the accompanying drawings, it is to be understood that various changes and modifications will be apparent to those skilled in the art. Therefore, unless otherwise such changes and modification depart from the scope of the present invention, they should be construed as being included therein.

What is claimed is:

1. An image pickup device comprising:
   an image sensor having rectangular light receiving portions arranged in a matrix, and microlenses disposed in correspondence with said light receiving portions, said light receiving portions and said microlenses being formed integrally with each other; and
   an image input optical system for forming an image on said image sensor, said image input optical system including a diaphragm;
   wherein the diaphragm has a shape in a vertical direction that coincides with a shape of said light receiving portions of said image sensor, said diaphragm restricting light along a horizontal direction to prevent the light from being incident outside the light receiving portions of the image sensor, and said diaphragm and the light receiving portions of said image sensor are in a conjugate relationship.

2. An image pickup device as claimed in claim 1, wherein said diaphragm has an oval shape having edges which are circular along the horizontal direction and linear along the vertical direction.

3. An image pickup device as claimed in claim 1, wherein said image sensor has charge transferring portions adjoining said light receiving portions.

4. An image pickup device as claimed in claim 1, wherein said diaphragm has a circular shape in a horizontal direction, said circular shape decided in accordance with the effective aperture of the image input optical system.

5. An image input optical system for forming an image on an image sensor which has rectangular light receiving portions arranged in a matrix, and microlenses disposed in correspondence with said light receiving portions, said light receiving portions and said microlenses being formed integrally with each other, comprising:
   at least one lens element; and
   a diaphragm whose shape in a vertical direction coincides with a shape of said light receiving portions of said image sensor, said diaphragm restricting light along a horizontal direction to prevent the light from being incident outside the light receiving portions of the image sensor;
   wherein said diaphragm is positioned so that said diaphragm and light receiving portions of said image sensor, positioned with respect to said image input optical system to have an image formed thereon, are in a conjugate relationship.

6. An image input optical system as claimed in claim 5, wherein said diaphragm has an oval shape having edges which are circular along the horizontal direction and linear along the vertical direction.

7. An image input optical system as claimed in claim 5, wherein said image sensor has charge transferring portions adjoining said light receiving portions.

8. An image input optical system as claimed in claim 5, wherein said diaphragm has a circular shape in a horizontal direction, said circular shape decided in accordance with the effective aperture of the image input optical system.

9. An image pickup device comprising:
   an image sensor having rectangular light receiving portions arranged in a matrix, charge transferring portions adjoining said light receiving portions, and microlenses disposed in correspondence with said light receiving portions, said light receiving portions, said charge transferring portions and said microlenses being formed integrally with each other; and
   an image input optical system for forming an image on said image sensor, said image input optical system including a diaphragm;
   wherein the diaphragm has a shape that coincides with a shape of said light receiving portions of said image sensor, said diaphragm restricting light along a direction perpendicular to the direction along which said charge transferring portions of the image sensor are positioned to prevent the light from being incident on the charge transferring portions of the image sensor, and said diaphragm and the light receiving portions of said image sensor are in a conjugate relationship.

10. An image pickup device comprising:

an image sensor having rectangular light receiving portions arranged in a matrix, and microlenses disposed in correspondence with said light receiving portions, said light receiving portions and said microlenses being formed integrally with each other; and an image input optical system for forming an image on said image sensor, said image input optical system including a light controlling means;

wherein the light controlling means has a shape in a vertical direction that coincides with a shape of said light receiving portions of said image sensor, said light controlling means restricting light along a horizontal direction to prevent the light from being incident outside the light receiving portions of the image sensor, and said light controlling means and the light receiving portions of said image sensor are in a conjugate relationship.

11. An image pickup device in accordance with claim 10 wherein:

said light controlling means is selected from the group consisting of a diaphragm and a light restricting plate.

12. An image pickup device in accordance with claim 10 wherein:

said light controlling means comprises a diaphragm.

13. An image pickup device in accordance with claim 12, further comprising:

a light restricting plate.

14. An image pickup device in accordance with claim 10 wherein:

said light controlling means comprises a light restricting plate.

15. An image pickup device in accordance with claim 14, further comprising:

a diaphragm.

* * * * *